United States Patent [19]

Pendleton

[11] 4,446,473
[45] May 1, 1984

[54] SERPENTINE CHARGE TRANSFER DEVICE

[75] Inventor: Joan Pendleton, Mountain View, Calif.

[73] Assignee: Fairchild Camera & Instrument Corporation, Mountain View, Calif.

[21] Appl. No.: 258,866

[22] Filed: Apr. 30, 1981

[51] Int. Cl.³ .................. H01L 29/78; G11C 19/28
[52] U.S. Cl. ........................................ 357/24; 377/62
[58] Field of Search ............... 357/24, 30; 377/57–63

[56] References Cited

U.S. PATENT DOCUMENTS

| | | | |
|---|---|---|---|
| 3,858,232 | 12/1974 | Boyle et al. | 357/24 |
| 4,103,347 | 7/1978 | Barton | 357/24 |
| 4,241,422 | 12/1980 | Gruter | 357/24 |
| 4,291,239 | 9/1981 | Weimer | 357/24 LR |
| 4,371,885 | 2/1983 | Parrish et al. | 357/24 |

OTHER PUBLICATIONS

Sei et al. "A Meander Channel CCD Linear Image Sensor" IEEE J. Solid State Circuits, vol. SC-13 (2/78) pp. 66–70.

*Primary Examiner*—Gene M. Munson
*Attorney, Agent, or Firm*—Kenneth Olsen; Carl L. Silverman; Ronald Craig Fish

[57] ABSTRACT

A serpentine charge transfer device is disclosed in which two parallel series of charge transfer wells are disposed adjacent to each other. Channel stops and electrically controllable barriers are suitably introduced into the two series to cause charge to flow in a serpentine fashion along the two series of charge transfer wells. The invention doubles the resolution of linear imaging devices.

24 Claims, 10 Drawing Figures

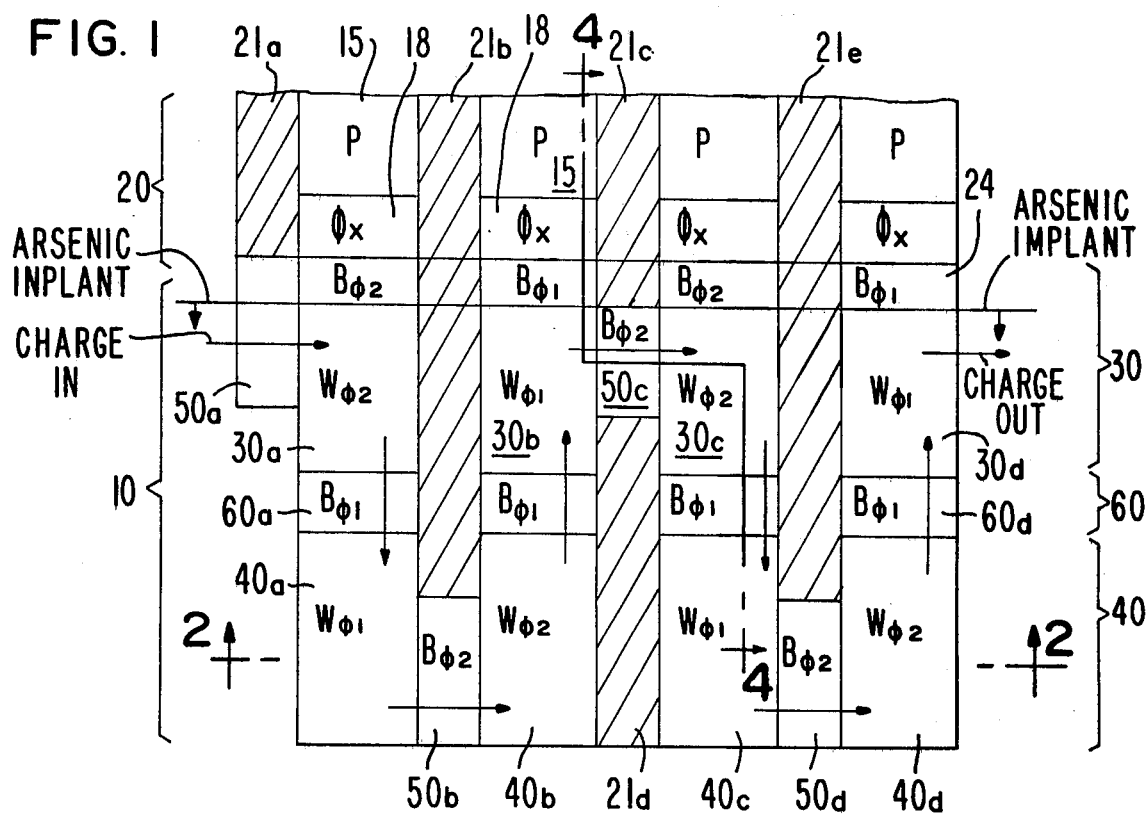
FIG. 1
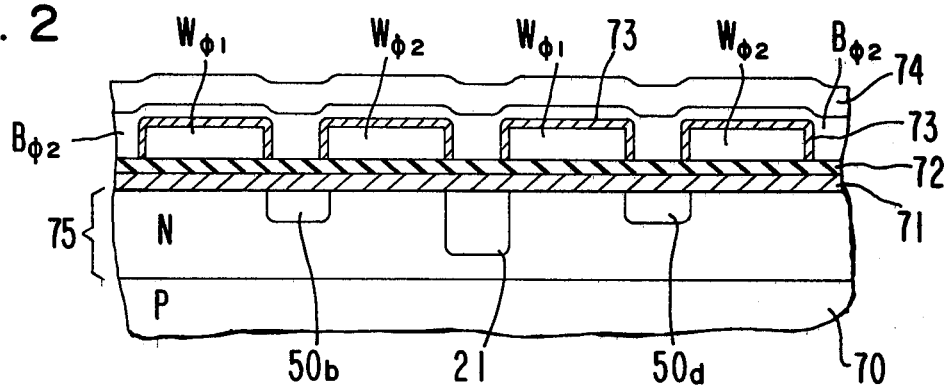
FIG. 2
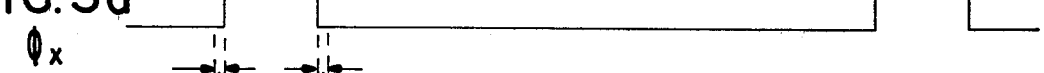
FIG. 3a $\phi_x$
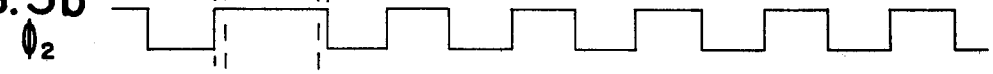
FIG. 3b $\phi_2$
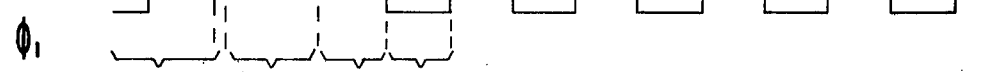
FIG. 3c $\phi_1$

φₓ LOW

φₓ HIGH, φ₂ LOW, φ₁ HIGH

φₓ LOW, φ₂ HIGH, φ₁ LOW

SERPENTINE CHARGE TRANSFER DEVICE

BACKGROUND OF THE INVENTION

1. Field of the Invention

This invention relates to integrated circuits, and in particular to charge transfer devices as applied to charge coupled linear imaging devices.

2. Description of the Prior Art

Charge coupled devices are widely known as one type of integrated electronic device, and are widely used as portions of commercially available linear imaging devices, area imaging devices, and memory devices. In typical linear imaging devices of the prior art, a series of photosites accumulate charge in response to ambient lighting conditions or other stimulus. The accumulated charge is transferred out of the photosites into wells of a charge transfer register where the accumulated charge may be transferred to a sense amplifier or other apparatus for detection or use. In most commercially available linear imaging devices, charge from the photosites is clocked into only every other well of a charge transfer register adjacent and parallel to the linearly arranged photosites. Charge cannot be placed in every charge transfer well adjacent the photosites because if any packet of charge is moved to an adjacent transfer well, that packet of charge becomes mixed with the charge already in the adjacent well and destroys the information content of both wells.

One known technique which permits the use of every well is to use ripple clocking in the charge transfer register. In using ripple clocking the charge packet in the first well is transferred to an adjacent empty well, followed by transferring the charge packet in the second well to the now empty first well, transferring the charge packet from the third well to the now empty second well, etc. Unfortunately, such ripple clocking is difficult to generate and control accurately, particularly for long registers, and requires a relatively long period of time in which to empty a large linear charge transfer register. For example, if the charge transfer device is 5000 wells long and only the first well is empty, then 5000 clock cycles are required to advance all of the charge stored from each well to the adjacent well. Even if additional empty wells are periodically distributed throughout the transfer register, a large number of clock cycles is still required. Obviously, in high-speed applications such slow clocking is undesirable.

Accordingly, in typical linear imaging applications, the charge from photosites has been transferred only into every other charge transfer well. Thus an empty well separates every pair of wells in which charge is stored. Using only two clock cycles (in a two phase charge coupled device) the charge in every well is advanced one well to the adjacent empty well. Because an empty well always separates each well used to store a charge packet, the contents of the wells do not mix and the integrity of the information represented by the charge packets is maintained. Accordingly, in a linear imaging device 5000 units long, 5000 clock cycles will empty every well in the device.

An inherent disadvantage of the prior art device utilizing only every other charge transfer well is the decrease in resolution of the linear imaging device. For example, if the wells in the charge transfer register can be fabricated at best only 13 microns apart, the photosites from which charge is transferred to a given register of charge transfer wells must be 26 microns apart. Because the photosites from which charge is transferred are 26 microns apart, the resolution of the device is reduced. No prior art solutions are known which eliminate this disadvantage and permit doubling the resolution of the linear imaging device while operating it at the same speed.

One prior art structure, however, which utilizes a serpentine arrangement of charge transfer wells in conjunction with a linear imaging sensor is disclosed in "A Meander Channel CCD Linear Image Sensor" by H. Sei et al., *IEEE Journal of Solid State Circuits*, Vol. SC-13, No. 1, February, 1978, pages 66–70. In that journal article, a structure is described which is depicted schematically in FIG. 5 herein. This structure does not permit any substantial increase in the number of charge transfer wells per unit length of the charge coupled device.

SUMMARY OF THE INVENTION

This invention provides a charge transfer device in which sequential charge transfer wells are arranged in a serpentine pattern. The pattern enables twice as many wells to be disposed within a given length in comparison to conventional linear imaging devices. Accordingly, the resolution of a linear imaging device utilizing this invention is doubled over that of conventional linear imaging devices fabricated using the same horizontal well spacing. Thus the present invention provides a way of doubling resolution and maintaining operating speed without requiring improved design layout rules or alignment tolerances.

In one embodiment a charge transfer device fabricated according to the invention comprises a first series of charge transfer wells arranged sequentially, each alternate well being separated from the following well by first electrically controllable barrier means and separated from the preceding well by channel stop means, and a second series of charge transfer wells arranged sequentially adjacent the first series but separated therefrom by second electrically controllable barrier means, each alternate well in the second series being separated from the following well by the channel stop means, and being separated from the preceding well by the first electrically controllable barrier means.

In a charge transfer device fabricated according to the invention, when applied to linear imaging devices, charge packets from each of the photosites are transferred into every charge transfer well adjacent the photosites. If the charge transfer wells adjacent the photosites are termed the first series and a two phase clock system is used, one phase may be clocked low to transfer the charge packets from every other one of the first series of charge transfer wells into every other one of the second series of charge transfer wells. Thus the charge packets accumulated by each of the photosites may be readily positioned in every other one of the combined first and second series of charge transfer wells. The two phase clock may be then used to transfer the charge out of the first and second series of charge transfer wells in a serpentine pattern to such external circuitry as desired.

The invention provides substantial advantage over prior art linear imaging structures by providing twice the number of charge transfer wells per unit length as conventional structures. Doubling the number of wells per unit length enables doubling the resolution of the linear imaging device.

BRIEF DESCRIPTION OF THE DRAWINGS

FIG. 1 is a schematic drawing of a top view of a charge transfer device fabricated according to the invention.

FIG. 2 is a cross-sectional view of the structure shown in FIG. 1.

FIG. 3a is a timing diagram showing the clock signal for emptying the photosites shown in FIG. 1.

FIG. 3b is a timing diagram showing the ∅2 clock signal applied to the barriers and wells shown in FIG. 1.

FIG. 3c is a timing diagram showing the ∅1 clock signal applied to the barriers and wells in FIG. 1.

DESCRIPTION OF THE PREFERRED EMBODIMENTS

Figure 4:
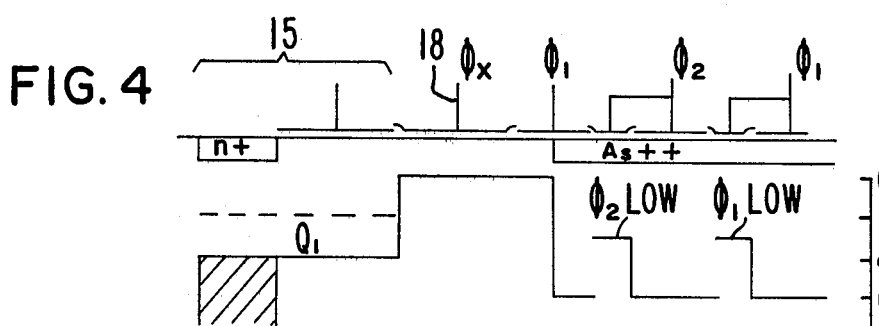
FIG. 4 is a cross-sectional view of a portion of FIG. 1.

A top view of the preferred embodiment of the charge transfer device 10 is shown in FIG. 1. The charge transfer device 10 is shown in conjunction with a linear imaging device 20 having a series of photosites 15, accompanying transfer gates 18 and channel stops 21. The charge transfer device 10 of this invention will typically be used in conjunction with a linear imaging device such as the one depicted. Other applications are also possible, for example, in signal processing or as a shift register.

Charge transfer device 10 includes a first series of charge transfer wells 30, a second series of charge transfer wells 40, a plurality of channel stops 21 and a plurality of each of electrically controllable barriers 50 and 60. Individual wells within series 30 are designated 30a, 30b, etc., while individual wells within series 40 are designated 40a, 40b, etc. Individual channel stops are designated 21a, 21b, etc., while individual barriers are designated 50a, 50b, ... 60a, 60b, etc. With the exception of wells at the ends of the series, each alternate well in the first series of charge transfer wells 30 is separated from the subsequent well by one of the plurality of first electrically controllable barriers 50 and from the preceding well by one of the plurality of channel stops 21. For example, well 30b is separated from well 30c by electrically controllable barrier 50c. Well 30b is separated from well 30a by channel stop 21b. The next alternate well 30d is similarly protected. Charge will not flow from one side of a channel stop 21 to the other with normally applied voltages, but will flow through the barrier regions 50 and if a large enough positive voltage is applied to an overlying electrode. In the same manner, each alternate well in the second series of charge transfer wells 40 is separated from the following well by a channel stop and from the preceding well by an electrically controllable barrier. For example, well 40b is separated from well 40c by channel stop 21d, and well 40b is separated from well 40a by an electrically controllable barrier 50b. The plurality of second electrically controllable barriers 60 separates the first series of wells 30 from the second series of wells 40. Corresponding wells, that is, wells in the same vertical column, in the first series 30 and the second series 40 have channel stops 21 and barriers 50 on opposite sides with respect to each other. For example, barrier 50c is on the left side of well 30c while barrier 50d is on the right side of corresponding well 40c.

In addition to its reference numeral, each well 30 or 40 and each electrically controllable barrier 50 or 60 is designated in FIG. 1 with the clock signal applied to it. For example, well 30a is also designated ∅2, well 40c designated ∅1, barrier 60a designated ∅1, and barrier 50c designated ∅2. The operation of the clock signals will be explained in conjunction with FIGS. 3 and 4. Generally, however, the charge transfer device 10 depicted in FIG. 1 may operate in either of two modes. In the first mode the transfer gates 18 are held at a low potential to prevent transfer of charge from the photosites 15 into the first series of charge transfer wells 30. In this mode of operation, the charge transfer device functions essentially as a shift register. In such operation charge packets enters the device 10 from other wells (not shown) at the left-hand end of device 10, for example, where designated by the arrow captioned "charge in." The charge packets are then shifted in a serpentine fashion as shown by the arrows along the device 10 and out from well 30d to desired external circuitry or additional wells. In this mode of operation, charge is transferred sequentially from well 30a to well 40a to well 40b to well 30b to well 30c to well 40c to well 40d to well 30d and then out. As will be explained, the transfer of charge from well to well is made possible by clock signals ∅1 and ∅2 applied to the designated barriers and wells shown in FIG. 1.

In a second mode of operation, the charge transfer device 10 accepts charge packets from the linear imaging device 20. In this mode device 20 is emptied of all charge packets when the potential of the transfer gates 18 is increased. As will be explained in conjunction with FIGS. 4a and 4b, the higher potential permits charge to flow from photosites 15 into the first series of charge transfer wells 30. The transfer gates 18 may then be returned to low potential and the charge packets, which originally accumulated in the photosites 15, are now stored in the transfer device 10. By holding ∅2 low and ∅1 high, charge from the ∅2 wells in the first series will move to the ∅1 wells of the second series. Charge is now stored in only and all of the ∅1 wells in each of first series 30 and second series 40. Charge may now be shifted out of the transfer device 10 to auxiliary amplifiers or other apparatus.

FIG. 2 is a cross-sectional view of the structure shown in FIG. 1. As shown in FIG. 2, in the preferred embodiment the charge transfer device 10 of this invention is fabricated using known semiconductor process technology in a silicon substrate 70. The term substrate is used herein to connote the material 70 in which the barriers and channel stops are formed, regardless of its conductivity type. A layer of gate oxide 71 is formed across the upper surface of substrate 70, followed by a layer of silicon nitride 72. Arsenic or other N conductivity type dopant is then introduced by ion implantation into the substrate 70 to define an upper N type region 75 as shown. Using, for example, ion implantation, barrier regions 50b and 50d may be formed by lightly doping the substrate 70 with boron. The P conductivity type boron compensates for some of the N dopant making the barrier areas not as heavily N doped as the wells. Later the substrate is more heavily doped with boron wherever a channel stop 21 is desired. Electrodes $W_{\phi 1}$ and $W_{\phi 2}$ for wells 30 and 40 are formed, typically from polycrystalline silicon, using well known integrated circuit fabrication techniques. A layer of insulating material 73 is formed and suitably patterned to electrically isolate the well electrodes $W_{\phi 1}$ and $W_{\phi 2}$ from the subsequently formed barrier electrodes $B_{\phi 2}$, also typically polycrystalline silicon. If desired, an additional layer of known passivating material 74 may be deposited across the upper surface of the charge transfer device as shown in FIG. 2.

FIGS. 3a, 3b and 3c illustrate timing diagrams for the clock signals applied to the structure shown in FIG. 1. FIG. 3a illustrates a typical transfer gate clock signal $\phi_x$. Application of $\phi_x$ permits transfer of the charge accumulated in photosites 15 into the first series of charge transfer wells 30. FIGS. 3b and 3c show clock signals $\phi 1$ and $\phi 2$ which are applied to the wells 30 and 40 and barriers 50 and 60. The $\phi 1$ and $\phi 2$ clock signals are applied to the structure depicted using a conventional two phase technique with polycrystalline silicon electrodes. As shown, whenever $\phi 1$ is low, $\phi 2$ is high, and vice versa. In this manner charge is shifted sequentially along the charge transfer device 10 in the manner depicted by the arrows in FIG. 1.

Figure 4A:
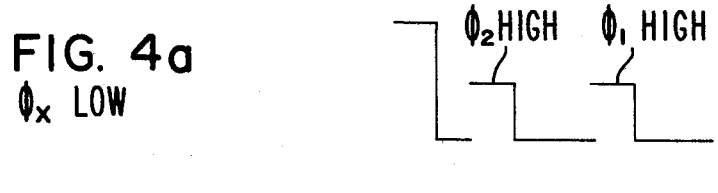
FIG. 4a is a diagram showing the accumulation of charge in the photosites with the transfer gate potential held low.
Figure 4B:
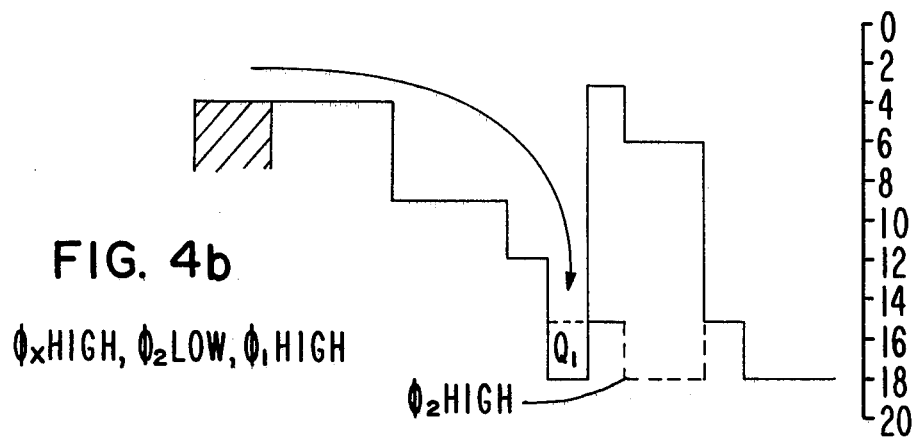
FIG. 4b is a diagram showing transfer of the charge from the photosites with the transfer gate potential increased.
Figure 4C:
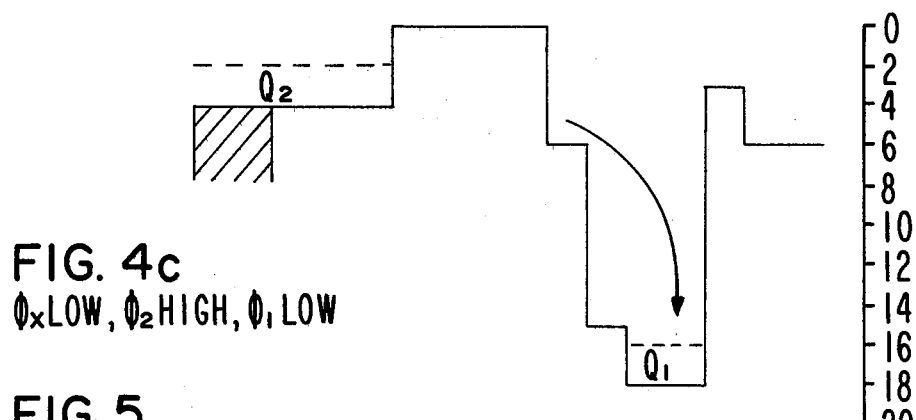
FIG. 4c shows the transfer of charge from beneath the ∅1 electrodes to beneath the ∅2 electrodes.
Figure 5:
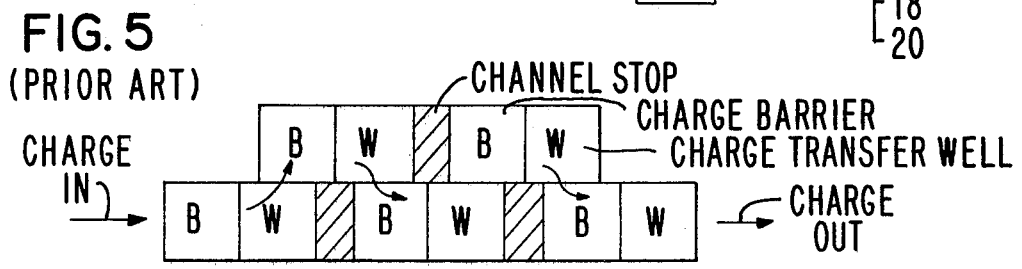
FIG. 5 is a prior art meander channel CCD structure.

FIGS. 4a through 4c illustrate the manner in which charge packet $Q_1$ which accumulates at photosite 15 is transferred from photosite 15 by transfer gate 18. In FIG. 4a charge packet $Q_1$ has accumulated in photosite 15. The low potential of signal $\phi_x$ prevents charge $Q_1$ from flowing out of photosite 15 into the charge transfer device 10. The electrodes receiving clock signals $\phi 1$ and $\phi 2$ are shown.

In FIG. 4b the potential of transfer gate $\phi_x$ has been increased together with the potential of clock signal $\phi 1$. In this manner charge packet $Q_1$ flows "downhill" to beneath the adjacent electrode having clock signal $\phi 1$ high. Charge flows into the $\phi 2$ wells adjacent the photosites in a similar way (not shown). The barrier between $\phi 1$ and $\phi 2$ prevents the charge packets $Q_1$ from flowing further.

Next, as shown in FIG. 4c, the clock signal on transfer gate 18 is reduced and a new charge packet $Q_2$ begins accumulating. The clock signal $\phi 1$ then stays high and $\phi 2$ goes low, causing the charge packet $Q_1$ to be transferred to beneath the electrode to which the $\phi 1$ clock signal has been applied. Subsequently $\phi 1$ and $\phi 2$ are raised and lowered as shown in FIGS. 3b and 3c to cause the charge packet $Q_1$ to move through charge transfer device 10.

In lower frequency applications, for example with clocks operating at 2.5 megaHertz, the $\phi 1$ and $\phi 2$ clock signals may be operated with uniform cycles regardless of the condition of the $\phi_X$ clock. Such uniform cycles are shown in the right hand portion of FIGS. 3b and 3c.

As is apparent, the charge transfer device of this invention effectively doubles the resolution of linear imaging devices with which it is used. Only a two phase clocking system is required by the charge transfer register. Thus, although one embodiment of the foregoing invention has been described, it is intended that various changes or modifications may be made to the embodiment within the scope of the appended claims. For example, other clocking systems may be used to control the serpentine charge transfer device.

What is claimed is:

1. A charge transfer device comprising:

a first series of charge transfer wells arranged sequentially, each alternate well separated from the subsequent well by first electrically controllable barrier means for controllably restricting charge flow thereunder and separated from the preceding well by channel stop means for preventing charge flow thereunder;

a second series of charge transfer wells arranged sequentially and disposed adjacent the first series but separated therefrom by second electrically controllable barrier means for controllably restricting charge flow thereunder, each alternate well in the second series being separated from the subsequent well by the channel stop means and separated from the preceding well by the first electrically controllable barrier means; and wherein a first clock signal controls alternate wells of the first and the second series of charge transfer wells, and the first clock signal controls the second electrically controllable barrier means and a second clock signal controls the remaining wells of each of the first and the second series of charge transfer wells, and the second clock signal controls the first electrically controllable barrier means.

2. Apparatus as in claim 1 wherein wells in the first series and the second series connected to receive the same clock signal have channel stop means on the same sides with respect to each other.

3. Apparatus as in claim 2 wherein each of the first series and the second series have the same number of charge transfer wells.

4. Apparatus as in claim 3 wherein wells in the first and the second series of wells adjacent each other are controlled by different clock signals.

5. Apparatus as in claim 1 wherein each well of the first series and the second series of charge transfer wells comprises a region in a semiconductor substrate.

6. Apparatus as in claim 5 wherein each of the channel stop means and each of the first and the second barrier means comprises regions of the semiconductor substrate into which an impurity has been introduced.

7. Apparatus as in claim 1 further including:

a plurality of photosite means for accumulating charge in response to ambient light; and transfer gate means separating the plurality of photosite means from the first series of charge transfer wells, whereby electrical signals applied to the transfer gate means permit transfer of accumulated charge from the photosite means into the first series of charge transfer wells.

8. Apparatus as in claim 7 wherein the first series of charge transfer wells is a linear arrangement of charge transfer wells.

9. Apparatus as in claim 8 wherein the second series of charge transfer wells is a linear arrangement of charge transfer wells parallel to the first series of charge transfer wells.

10. Apparatus as in claim 9 wherein the photosite means are linearly arranged parallel to the first series of charge transfer wells.

11. Apparatus as in claim 1 wherein the first electrically controllable barrier means comprises a first plurality of electrically controllable barriers and the second electrically controllable barrier means comprises a second plurality of electrically controllable barriers.

12. Apparatus as in claim 11 wherein the channel stop means comprises a plurality of channel stops.

13. Apparatus as in claim 12 wherein the charge transfer wells, the first plurality and the second plurality of electrically controllable barriers and the plurality of channel stops are disposed to cause a charge packet being transferred along the charge transfer device to pass sequentially through a first well of the first series, a first barrier of the second plurality of electrically controllable barriers, a first well of the second series, a first barrier of the first plurality, a second barrier of the second plurality, a second well of the first series, and a second barrier of the first plurality.

14. A charge transfer device comprising:

a first linear row of charge transfer wells, every other one of the first wells being separated from the next following well by a channel stop means for preventing charge flow thereunder, and each of the remaining first wells being separated from the next following first well by a first barrier means for controllably restricting charge flow thereunder;

a second linear row of charge transfer wells disposed parallel to the first row and separated therefrom by a second barrier means for controllably restricting charge flow thereunder, every other one of the second wells being separated from the next following well by the first barrier means, and each of the remaining second wells being separated from the next following second well by the channel stops means; whereby wells in the first row and the second row adjacent each other have channel stop means disposed on opposite sides with respect to each other;

means for applying a first clock signal to the every other well of both the first row and the second row and to the second barrier means; and means for applying a second clock signal to all remaining wells and to the first barrier means.

15. Apparatus as in claim 14 wherein each of the means for applying the first and the second clock signals comprises a plurality of electrodes.

16. Apparatus as in claim 15 wherein each of the charge transfer wells comprises a separate region in a semiconductor substrate.

17. Apparatus as in claim 16 wherein each of the first and the second barrier means and the channel stop means comprises a separate region in the semiconductor substrate into which an impurity has been introduced.

18. A charge transfer device comprising:

a first series of charge transfer wells arranged sequentially, each alternate well separated from the subsequent well by first electrically controllable barrier means for controllably restricting charge flow thereunder and separated from the preceding well by channel stop means for preventing charge flow thereunder;

a second series of charge transfer wells arranged sequentially and disposed adjacent the first series but separated therefrom by a second electrically controllable barrier means for controllably restricting charge flow thereunder, each alternate well in the second series being separated from the subsequent well by the channel stop means for preventing flow thereunder and separated from the preceding well by the first electrically controllable barrier means;

a plurality of photosite means for accumulating charge in response to ambient light; and transfer gate means separating the plurality of photosite means from the first series of charge transfer wells, wherein electrical signals applied to the transfer gate means permit transfer of accumulated charge from the photosite means into the first series of charge transfer wells.

19. Apparatus as in claim 18 wherein the first series of charge transfer wells is a linear arrangement of charge transfer wells.

20. Apparatus as in claim 19 wherein the second series of charge transfer wells is a linear arrangement of charge transfer wells parallel to the first series of charge transfer wells.

21. Apparatus as in claim 20 wherein the photosite means are linearly arranged parallel to the first series of charge transfer wells.

22. Apparatus as in claim 18 wherein the first electrically controllable barrier means comprises a first plurality of electrically controllable barriers and the second electrically controllable barrier means comprises a second plurality of electrically controllable barriers.

23. Apparatus as in claim 22 wherein the channel stop means comprises a plurality of channel stops.

24. Apparatus as in claim 23 wherein the charge transfer wells, the first plurality and the second plurality of electrically controllable barriers and the plurality of channel stops are disposed to cause a charge packet being transferred along the charge transfer device to pass sequentially through a first well of the first series, a first barrier of the second plurality of electrically controllable barriers, a first well of the second series, a first barrier of the first plurality, a second well of the second series, a second barrier of the second plurality, a second well of the first series, and a second barrier of the first plurality.

* * * * *